(12) United States Patent
Elser et al.

(10) Patent No.: US 10,082,346 B2
(45) Date of Patent: Sep. 25, 2018

(54) COOLING MODULE AND APPARATUS FOR THERMALLY TREATING SUBSTRATES

(75) Inventors: Hans-Peter Elser, Ulm-Einsingen (DE); Matthias Tumback, Uberling (DE); Reinhard Lenz, Blaubeuren (DE); Moritz Vogt, Stuttgart (DE)

(73) Assignee: Centrotherm International AG (DE)

( * ) Notice: Subject to any disclaimer, the term of this patent is extended or adjusted under 35 U.S.C. 154(b) by 932 days.

(21) Appl. No.: 13/994,796

(22) PCT Filed: Jan. 27, 2012

(86) PCT No.: PCT/EP2012/000379
§ 371 (c)(1),
(2), (4) Date: Jul. 29, 2013

(87) PCT Pub. No.: WO2012/100958
PCT Pub. Date: Aug. 2, 2012

(65) Prior Publication Data
US 2013/0299130 A1 Nov. 14, 2013

(30) Foreign Application Priority Data
Jan. 28, 2011 (DE) .................. 10 2011 009 693

(51) Int. Cl.
*F27B 9/06* (2006.01)
*F28F 9/00* (2006.01)
*H01L 21/67* (2006.01)

(52) U.S. Cl.
CPC .......... *F28F 9/00* (2013.01); *H01L 21/67098* (2013.01)

(58) Field of Classification Search
CPC ................ F28F 9/00; H01L 21/67098; H01L 21/67109; H01L 21/67103;
(Continued)

(56) References Cited

U.S. PATENT DOCUMENTS

| 4,574,182 A | 3/1986 | Pescatore et al. |
| 5,440,101 A | 8/1995 | Cox et al. |

(Continued)

FOREIGN PATENT DOCUMENTS

| DE | 102010054114 | 6/2012 |
| EP | 0109892 | 5/1984 |

(Continued)

*Primary Examiner* — Shawntina Fuqua
(74) *Attorney, Agent, or Firm* — Tarolli, Sundheim, Covell & Tummino LLP

(57) ABSTRACT

A cooling module for cooling substrates, in particular solar cells having a paste printed thereon after passing through a heating module is described. The cooling module comprises an elongated cooling chamber having an inlet opening, which is adjacent to a heating module, and an outlet opening, as well as a transport unit for transporting substrates through the elongated cooling chamber, wherein the transport unit defines a transport plane for the substrates. At least one first cooling unit is provided. The cooling unit has a plurality of first plate elements, which are arranged in substance perpendicular to and above the transport plane in the cooling chamber, at least one first conduit which extends through the first plate elements and is in a thermally conducting relationship therewith, and at least one conveying unit for conveying a cooling fluid through the first conduit. A conveying unit for conveying gas, in particular air, via spaces between the plate elements towards the transport plane is also provided. Also, an apparatus for thermally treating substrates, in particular solar cells, having a paste printed thereon is described. Said apparatus comprises a heating module having an elongated heating chamber and at least one adjacent cooling module having an elongated cooling chamber. A transport unit for transporting that substrates through the heating chamber and the cooling chamber is provided, wherein the transport unit comprises a revolving, gas permeable transport belt, which forms a
(Continued)

transport section and a return section. The transport section extends through the heating chamber and the cooling chamber, while the return section has a portion which extends through at least a portion of the cooling chamber and wherein the return section is arranged outside of the heating chamber.

13 Claims, 3 Drawing Sheets

(58) Field of Classification Search
CPC .......... H01L 21/67115; H01L 21/6773; H01L 21/67739; H01L 21/67748; H01L 21/67754; H01L 21/6776
See application file for complete search history.

(56) References Cited

U.S. PATENT DOCUMENTS

| | | |
|---|---|---|
| 2005/0109759 A1 | 5/2005 | Richert et al. |
| 2009/0206145 A1 | 8/2009 | Tamori et al. |
| 2010/0267188 A1 | 10/2010 | Parks et al. |
| 2011/0013892 A1 | 1/2011 | Ragay et al. |

FOREIGN PATENT DOCUMENTS

| | | | |
|---|---|---|---|
| EP | 1783337 | | 5/2007 |
| EP | 1783837 | * | 5/2007 |
| JP | 2010210184 | * | 9/2010 |

* cited by examiner

COOLING MODULE AND APPARATUS FOR THERMALLY TREATING SUBSTRATES

RELATED APPLICATIONS

This application corresponds to PCT/EP2012/000379, filed Jan. 27, 2012, which claims the benefit of German Application No. 10 2011 009 693.0, filed Jan. 28, 2011, the subject matter of which are incorporated herein by reference in their entirety.

BACKGROUND OF THE INVENTION

The present invention relates to a cooling module and an apparatus for thermally treating substrates, in particular, solar cells having an ink or paste printed thereon.

In the solar cell technology it is known to print electrically conducting screen printing paste onto solar cell substrates for forming electrical conductors. Such paste or ink is typically initially dried after application thereof in a dryer module, in order to evaporate solvents. Subsequently, the substrates are thermally treated, in order to form the electrical characteristics of the paste to obtain electrical conductors. The substrates are typically heated to temperatures of approx. 900° C. Thereafter, the substrates are again cooled in a cooling module.

For a high throughput, the modules are typically formed as continuous modules and are arranged directly adjacent to each other. Typically, a single transport unit, for example in the shape of a transport belt, is provided, which transports these substrates consequently through the dryer module, the heating module and the cooling module. It is also possible, to separate the processes of drying, heating and/or cooling from the other of these processes and to provide a separate transport unit for each module.

Providing separate transport units, however, may lead to transfer problems between the transport units, and furthermore, separate transport belts would also require separate drives, which may increase the complexity of the overall apparatus.

Therefore, a single transport unit, which has a transport belt running through all modules is preferred. This, however, leads to the problem that within the heating module, not only the substrates to be treated but also the transport belt itself is heated, thereby increasing the cooling effort required within the cooling module. It is known to provide a water cooled stainless steel wall within the cooling module, which extends substantially parallel to the transport belt, in order to receive radiant heat. Furthermore, it is known to conduct pressurized air onto the substrates in order to additionally cool the same. The currently used stainless steel wall, however, does not have sufficient absorption characteristics in order to absorb the whole radiant heat, such that at least a part of the radiant heat of the substrates and/or of the transport belt is reflected back to the same.

Thus, relatively long cooling trucks are required until the substrates have a sufficiently reduced temperature, in order to be transferred to a downstream transport mechanism. Furthermore, the transport belt still has an increased temperature, which requires the use of special guide and drive elements. In particular, the transport belt typically has a temperature, which excludes the use of drive and/or guide rollers made of rubber or having a rubberized surface. Such rollers, however, would be advantageous for a smoother driving of the belt and with respect to the overall cost of the transport mechanism.

SUMMARY OF THE INVENTION

It is therefore an object of the present invention to provide a cooling module and an apparatus for thermally treating substrates, which provides better cooling of the substrates and/or of a transport belt.

In accordance with the present invention, this object is solved by a cooling module for cooling substrates in accordance with claim 1 and an apparatus for thermally treating substrates in accordance with claim 11.

The cooling module for cooling substrates is particularly suited for cooling solar cells having a paste printed thereon after passage through a heating module, and the cooling module has an elongated cooling chamber having an inlet opening adjacent to the heating module, and an outlet opening. A transport unit for transporting substrates through the elongated cooling chamber is provided, wherein the transport unit defines a transport plane for the substrates. The cooling module comprises at least one first cooling unit, which has a plurality of first plate elements, which extend in substance perpendicular to and above the transport plane within the cooling chamber. The first cooling unit furthermore comprises at least one first conduit, which extends through the first plate elements and is in a thermally conducting relationship therewith, as well as at least one conveying unit for conveying a cooling fluid through the first conduit. Additionally, the cooling module comprises a conveying unit for conveying gas, in particular air, via gaps between the plate elements towards the transport plane.

In providing a plurality of first plate elements, which extend in substance perpendicular to and above the transport plane in the cooling chamber, the surface for absorption of heat radiation, which is emitted by substrates and/or the transport unit, may be increased. Due to the perpendicular arrangement, reflection back towards the substrates and/or the transport unit is prevented. Due to respective cooling of the plate elements, a substantially complete absorption of heat radiation may be achieved due to multiple reflections thereof between the plate elements. In addition to absorbing the heat radiation, cooling of the substrates, the transport unit and of the first plate elements may be provided by a gas flow, which is directed via the gaps between the plate elements towards the transport plane of the transport unit.

In one embodiment of the invention at least a second cooling unit is provided, which has a plurality of second plate elements, which extend in substance perpendicular to and below the transport plane in the cooling chamber. The second cooling unit furthermore has a second conduit, which extends through the second plate elements and is in a thermally conducting relationship therewith and at least one conveying unit for conveying a cooling fluid through the second conduit. The second cooling unit additionally provides cooling of the backside of the transport unit and/or of the substrate, thereby further increasing the respective cooling effect. The perpendicular arrangement furthermore allows a good passage of a substantially vertical gas flow through the cooling chamber. The first and/or second plate elements preferably extend in the longitudinal direction of the cooling chamber.

The transport unit may comprise a revolving, gas permeable transport belt having a transport section and a return section, wherein at least one portion of the transport section and at least one portion of the return section extend through at least one portion of the cooling chamber. In this arrangement, one portion of the transport section as well as a portion of the return section is arranged within the cooling chamber, thereby achieving a two-fold cooling of each portion of the transport belt within the cooling chamber (within the transport section and the return section). Thereby, the transport belt may be additionally cooled over known systems, where the return section extends outside the cooling chamber. It may, in particular, be cooled to temperatures, which enable use of drive and/or guide rollers made of rubber or having a rubberized surface. Preferably, the second cooling unit is arranged between the portion of the transport section and the portion of the return section, such that the second cooling unit may receive heat radiation from the transport belt from a portion of the transport section as well as a portion of the return section and furthermore allows a good passage of a gas, in particular cooling air through the transport belt in this portion thereof.

The cooling chamber may have at least two sections in the longitudinal direction thereof, wherein in each section a conveying unit for conveying gas through the cooling chamber is provided, wherein the section, which is closer to the inlet opening of the cooling chamber, may optionally and at least partially be provided with gas from a neighboring section. This reduces on the one hand the gas consumption and on the other hand prevents that directly adjacent to the heating module too strongly cooled gas is directed onto the substrates and/or the transport belt to be cooled, which could lead to inhomogeneous cooling and warping of the substrate and/or the transport belt. Furthermore, different flow velocities of the gases may be set in the sections, whereby different cooling effects may be obtained. In particular, in the section which is closer to the inlet opening of the cooling chamber, a lower flow velocity of the gas may be set, since here a cooling is primary achieved via heat radiation, wherein in the consequent sections a higher flow velocity may be set, in order to provide cooling primarily via the gas flow.

In accordance with one embodiment of the invention, the conveying unit for conveying gas comprises at least a first blower for blowing gas into the cooling chamber and a second blower for aspirating gas from the cooling chamber, wherein the first and second blowers are arranged on opposite sides of the cooling chamber and are in communication with respective flow openings. By this means, a substantially straight gas flow through the cooling chamber may be achieved. The blowers are preferably in substance matched to each other, such that the air provided via the first blower is in substance completely removed via the second blower. In so doing, it is prevented that a substantial portion of the air exits the cooling chamber in an uncontrolled manner. In particular, it is possible to set the blowers such that slightly more air is aspirated from than blown into the cooling chamber, such that a gas flow into the cooling chamber via the inlet and/or outlet opening is achieved. In so doing, insulation with respect to the environment may be provided in an effective manner. The term "substantially" should encompass deviations from the supplied and discharged air of at most±10% and preferably smaller than ±5% starting from the supplied amount of air.

Preferably, the conveying unit for conveying gas comprises means for distributing the gas transferred to the cooling chamber in a homogeneous manner, in order to allow a homogeneous cooling of the substrate and/or a transport belt in a transverse direction, in order to prevent warping thereof.

In accordance with the invention, the object is also solved by an apparatus for thermally treating substrates, in particular solar cells having a paste printed thereon, said apparatus comprising a heating module having an elongated heating chamber and an adjacent cooling module having an elongated cooling chamber. The apparatus also comprises a transport unit for transporting the substrates through the heating chamber and the cooling chamber, wherein the transport unit comprises a revolving, gas permeable transport belt having a transport section and a return section. The transport section extends through the heating chamber and the cooling chamber and the return section comprises at least one portion, which extends through at least a portion of the cooling chamber, wherein the return section of the transport belt is, however, arranged outside of the heating chamber. This allows a better cooling of the transport belt within the cooling chamber and the risk of again heating the transport belt in the area of the heating chamber is prevented. The cooling module is constructed as described above. The apparatus may also comprise a drying module having an elongated drying chamber, wherein the transport section of the transport belt also extends through the drying chamber. In so doing, a single transport belt may be used, which extends through all modules and thus obviates transfer problems between different transport units.

BRIEF DESCRIPTION OF THE DRAWINGS

The invention will be explained in more detail herein below with reference to the drawings; in the drawings.

DESCRIPTION

Figure 1:
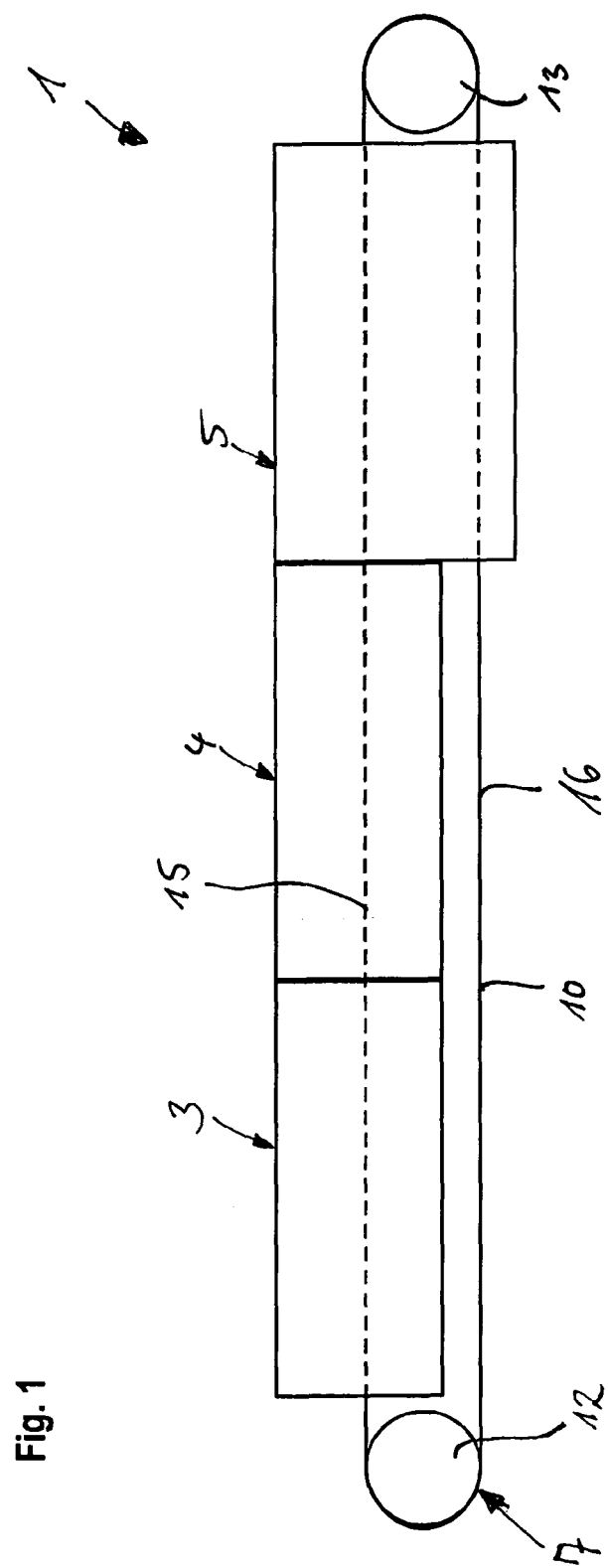
FIG. 1 is a schematic side view of an apparatus for thermally treating substrates.

In the following description the terms such as above, below, right and left refer to the presentation in the drawings and are not to be seen in a limiting sense, even though they may relate to preferred arrangements.

FIG. 1 shows a schematic side view of an apparatus 1 for thermally treating substrates and in particular for the thermal treatment of solar cell substrates having electrically conducting screen printing paste printed thereon for the formation of electrical conductors. The apparatus 1 comprises a drying module 3, a heating module 4, which is also known as a firing module, a cooling module 5 and a transport unit 7. The drying module 3, the heating module 4 and the cooling module 5 are each represented in FIG. 1 only as a box. The drying module 3 may in particular have a construction as described in the not pre-published DE 10 2010 054 114. The heating module 4 may preferably have a construction as described in the not pre-published DE 10 2010 054 919. These two documents are incorporated herein by reference with respect to the construction of the respective modules 3, 4, in order to avoid repetition.

The cooling module 5 will be explained herein below in greater detail with reference to FIGS. 2 and 3. The transport unit 7 consists in substance of a revolving transport belt 10 which is guided around drive- and/or guide rollers 12, 13. The transport belt 10 may for example be of a metal mesh, which is capable of withstanding the temperatures occurring during the thermal treatment of the substrates. Due to the construction as a metal mesh belt, the transport belt 10 is gas permeable. The transport belt 10 may also have a different construction, wherein the gas permeability should be ensured.

In the embodiment shown in FIG. 1, it is preferred that the roller 12 is a drive roller, while roller 13 is purely a guide roller. The drive roller 12 is rotatable such that the transport belt 10 may be driven to revolve clockwise.

FIG. 1 only shows two rollers 12, 13, but it should be noted that between the two rollers 12, 13 a plurality of further rollers may be provided for guiding the transport belt. In particular, also tensioning rollers may be provided in order to provide a predetermined tension for the transport belt 10. The transport belt 10 has an upper transport section 15 extending through the drying module 3, the heating module 4 and the cooling module 5. The transport belt 10 also has a lower return section 16 extending between the rollers 12, 13, which section has a portion which extends through the cooling module 5 and also has a portion which extends below the drying module 3 and the heating module 4. As the skilled person will realize, each portion of the transport belt 10 will be cooled twice during a single revolution thereof, since each portion runs through the cooling module 5 twice during a single revolution of the transport belt. This enables the transport belt to be sufficiently cooled such that the roller 12, which may be the drive roller, may for example be made of rubber or may have a rubber coating. Such a roller may provide a smooth drive and is in particular inexpensive with respect to other drive rollers which are capable of driving a metal mesh belt, and which rollers are capable of withstanding higher temperatures.

Figure 2:
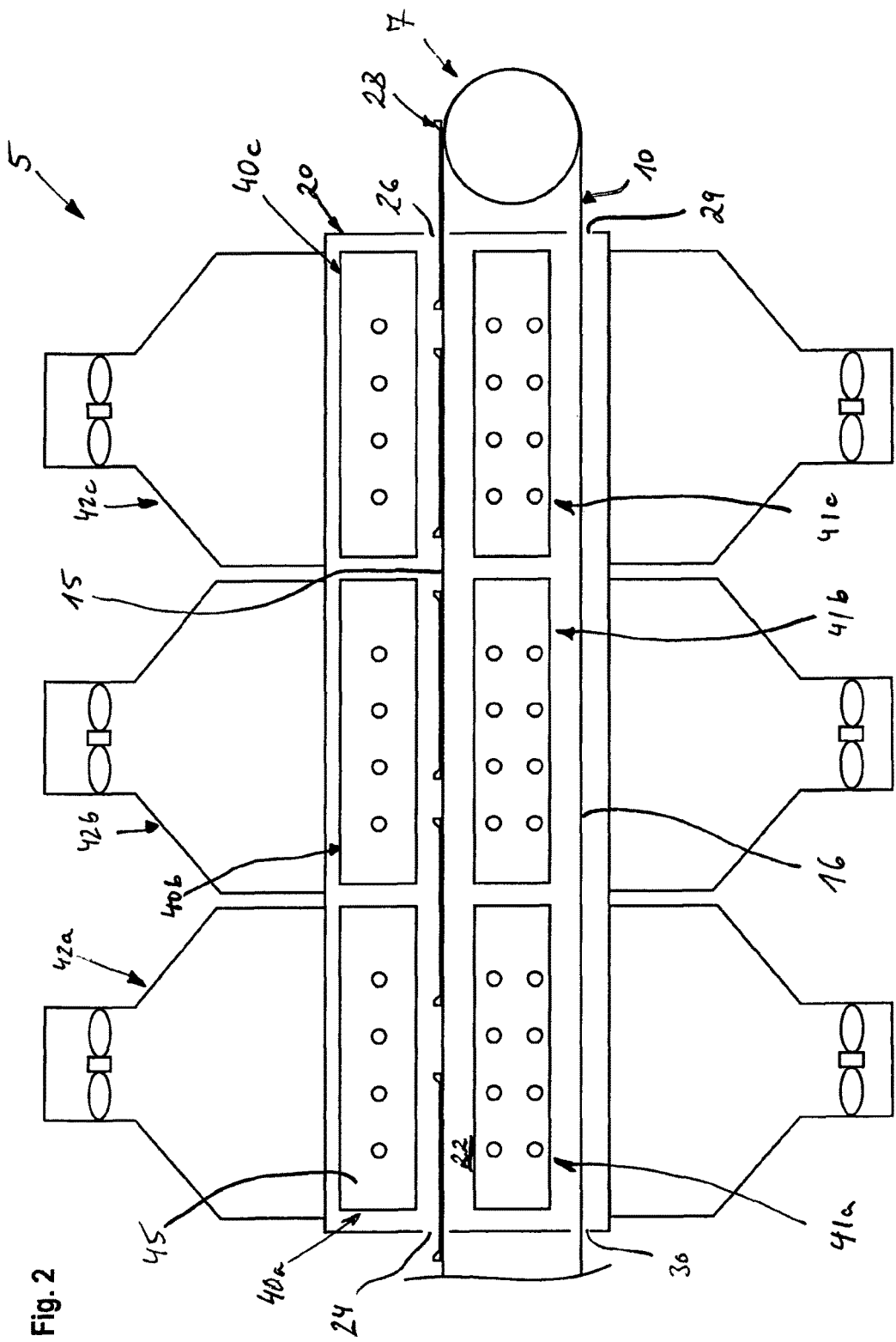
FIG. 2 is a schematic longitudinal sectional view of a cooling module for an apparatus for thermally treating substrates.
Figure 3:
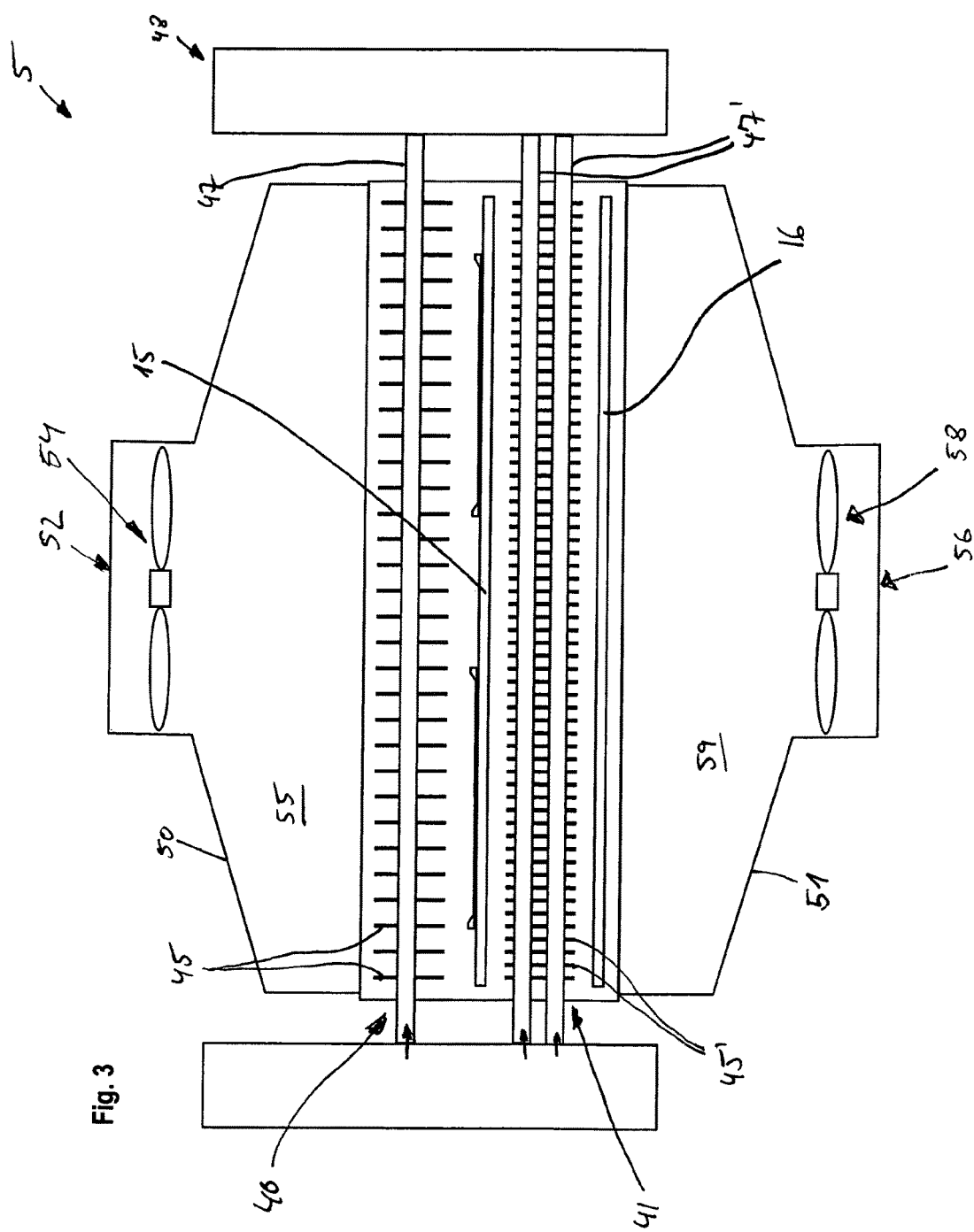
FIG. 3 is a schematic cross-sectional view of the cooling module of FIG. 2.

FIGS. 2 and 3 show a schematic longitudinal sectional view and a schematic cross-sectional view, respectively, of a cooling module 5, which may for example be used in the apparatus 1 for thermally treating substrates in accordance with FIG. 1.

The cooling module 5 has a housing 20, which forms a longitudinal cooling chamber 22 therein. The housing 20 has an inlet opening 24 adjacent to an outlet opening of a not shown adjacent heating module. Furthermore, the housing 20 has an outlet opening 26. The inlet opening 24 and the outlet opening 26 are sized such that the transport belt 10 of the transport unit 7, having a substrate carrier 28 and a substrate thereon may move therethrough. In FIG. 2 substrate carriers 28 are shown, which are transported on the transport section 15 of the transport belt 10 through the cooling module. After transporting the substrate carriers 28 through the cooling module 5, the substrate carriers may be transferred to a downstream transport mechanism, which is not shown. The actual substrates to be treated are not shown in the figures.

The housing 20 further comprises inlet and outlet openings 29, 30, which are sized for passage of the transport belt 10 without the substrate carrier 28 thereon. The inlet and outlet openings 29, 30 are used for passage of a portion of the return section 16 of the transport belt 10 through the cooling chamber 22 of the cooling module 5, as will be explained in more detail herein below. The cooling module 5 comprises three first cooling units 40a, 40b and 40c, second cooling units 41a, 41b, 41c arranged below the first cooling units and air guide units 42a, 42b and 42c, which are arranged in a consecutive manner in a longitudinal direction of the cooling chamber 22.

The first and second cooling units 40, 41 and a respective air guide unit 42 are arranged in groups in the longitudinal direction of the cooling chamber 22 in accordance with their suffix (a, b or c). The groups thus partition the cooling chamber 22 in three sections. The first cooling unit 40a, 40b and 40c may each have in substance the same construction such that in the following it is generally referred to a first cooling unit 40 when allocation of the same to a specific group is not relevant. This is also true for the second cooling units 41a-c and the air guide units 42a-c, which are respectively called second cooling unit 41 and air guide unit 42, respectively.

The first cooling unit 40 consists in substance of a plurality of plate elements 45, a cooling fluid conduit 47 and a cooling fluid conveying unit 48. The plate elements 45 are in substance arranged parallel to each other such that they extend in a longitudinal direction over a certain section of the cooling chamber 22. The plate elements 45 are arranged in substance perpendicular to the transport section 15 of the transport belt 10 and above the same, as is best seen in FIG. 3. The plate elements may be of a suitable material, which may absorb heat radiation, such as a sheet of stainless steel. It is also possible to provide the plate elements completely or partially with a coating, for absorbing heat radiation, such as a colored coating, in particular with black paint. Obviously also other materials for the plate elements 45 may be provided. The wording "substantially" with respect to the arrangement of the plate elements should encompass deviations in the area of at most±10% and preferably smaller than ±5% and of at most±10° and preferably smaller than±5°, respectively.

The cooling fluid conduits 47 extend perpendicular through the plate elements 45 as is best shown in FIG. 3 and are in a thermally conducting relationship therewith, in particular in a direct or indirect contacting relationship. As is best shown in FIG. 2, for each plate element 45 four cooling fluid conduits 47 are provided, which are spaced from each other in a transverse direction of the cooling chamber 22. As the skilled person will realize, a larger or a smaller number of cooling fluid conduits for the plate elements 45 may be provided.

The cooling fluid conduit 47 is connected at its opposite ends with a cooling fluid conveying unit 48, which is for example capable of conducting a cooling fluid from left to right (in accordance with FIG. 3) through the cooling fluid conduit 47, as is indicated by the arrow. Water may be used as a cooling fluid or any other suitable cooling fluid may be used, which may be circulated in a substantially closed loop between the cooling fluid conveying units 48. Return conduits are not shown in FIG. 3.

The second cooling units 41 are constructed in substantially the same manner as the first cooling units 40. In particular, the second cooling units 41 also comprise a plurality of plate elements 45', which are arranged parallel to each other, and which extend in a transverse direction of the cooling chamber 22. The plate elements 45' of the second cooling units 41 are, however, arranged between the transport section 15 and the return section 16 of the transport belt 10 within the cooling chamber 22. Furthermore, the plate elements 45' have a closer spacing than the plate elements 45 of the first cooling units. Furthermore, the second cooling units 41 have two rows of cooling fluid conduits 4T arranged on top of each other, as shown in FIGS. 2 and 3. These cooling fluids conduits again are connected to the cooling fluid conveying units 48. The first and second cooling units 40, 41 may use the same cooling fluid conveying units 48 or they may use separate cooling fluid conveying units 48.

The air guide units 42 each have an upper air guide housing 50 and a lower air guide housing 51. The upper air guide housing 50 has an inlet opening 52, in which an air conveying unit 54 in the form of a blower wheel or impeller is arranged. The air conveying unit 54 or the blower is arranged such that the gas, in particular air, is conveyed into the housing 50. Instead of a blower wheel or impeller also any other type of air conveying unit may be provided. The upper housing 50 forms an interior flow space 55, which on one side is bounded by an upper side of the housing 20 forming the cooling chamber 22. In the upper side of the housing 20 a plurality of flow openings (not shown) is provided, which connect the flow space 55 with the cooling chamber 22. The plurality of openings and the flow space 55 are shaped such that over the width of the cooling chamber 22 a substantially homogeneous air flow into the cooling chamber 22 may be provided.

The lower air guide housing 51 has an outlet opening 56, in which an air conveying unit 58 in the shape of a blower wheel or impeller is arranged, such that it may convey gas, in particular air, from a flow chamber 59 formed within the housing 51 to the outside. The lower air guide housing 51 is connected to a lower side of the housing 20 forming the cooling chamber 22. In this lower side of the housing 20 a plurality of not shown flow openings is provided, which connect the flow chamber 59 in the lower housing 51 with the cooling chamber 22.

By arranging the air guide unit 42 in this manner it is possible to provide in each section a substantially perpendicular gas or air flow, respectively, through the cooling chamber 22. It runs between the respective plate elements 45 and 45', respectively, of the first and second cooling units 40, 41 and may provide additional cooling thereof. The air also flows through the transport section 15 and the return section 16 of the transport belt 10 in order to cool the same. When the substantially perpendicular air flow hits a substrate, it is deflected by the substrate, flows over the surface thereof and is then again deflected downwards at the sides or edges of the substrates.

The blowers 54 and 58 are matched to each other such that the air supplied via the blower 54 is in substance completely removed or discharged from the cooling chamber 22 via the blower 58. Since the air will be heated while flowing through the cooling chamber 22 and will thus expand, the blower 58 should be operated such, that it conveys a larger air volume than the blower 54. When referring to the air being substantially completely discharged, this is supposed to mean the preferably more than but at least 90% of the supplied air, in particular at least 95% of the supplied air, is discharged via the blower 58.

The outlet opening 56 of the air guide unit 42b is connected via a conduit which is not shown to the inlet opening 52 of the air guide unit 42a, such that in the area of the air guide unit 42a in substance preheated air is used. This has the advantage that an excessively strong air cooling is prohibited in the entrance section of the cooling module 5. It is not required that only preheated air is used. Fresh air may also be supplied in order to adjust a desired temperature of the air supplied by the air guide unit 42. A corresponding conduit may also be provided between the outlet 56 of the air guide unit 42c and the inlet of the air guide unit 42b in order to also use preheated air in this section. In so doing, the proportion of required fresh air may be reduced. The air being discharged from the outlet 56 of the air guide unit 42a is usually discharged in a controlled manner, and it may optionally also be used as preheated air for the dryer module 3. It is also possible to guide the air through a heat exchanger in order to transfer the heat for different purposes to another medium.

The air guide units 42a, 42b and 42c may provide different air flows in the respective sections. In particular, the air guide unit 42a may provide a smaller air flow than the air guide units 42b and 42c. Thus, in the area of the air guide unit 42a, cooling of the substrate and the transport belt may be achieved primarily via heat radiation, which is absorbed via the cooling units 40a and 41a. In the area of the air guide units 42b and 42c on the other hand, cooling may primarily be achieved via the air flow.

Subsequently, operation of the thermal treatment apparatus will be explained in more detail.

Initially, solar cells having screen print paste printed thereon are loaded into substrate carriers 28 and are transferred to the transport belt 10. The transport belt 10 conveys the substrate carriers and the substrates therein successively through the drying module 3, the heating module 4 and the cooling module 5. Thereafter, the substrate carriers and the substrate thereon are removed from the transport belt 10.

Within the drying module, the screen print paste is first dried, as described in DE 10 2010 054 114. In the heating module, the dried paste is then fired, thus forming the electrical conductors.

Within the cooling module, the substrates are then cooled in a controlled manner, wherein cooling is achieved within the first of the sections primarily via heat radiation, while in the following sections cooling is primarily achieved via a gas flow, in particular an air flow. Simultaneously, with the cooling of the substrates, the transport belt 10 is also cooled. Each portion of the transport belt runs twice through the cooling module during a single revolution of the transport belt.

The invention was described herein above with respect to preferred embodiments of the invention without being limited to the specific embodiments. For example, the drying module may be dispensed with, if for example an off-line drying of the screen print paste is provided. Furthermore, solvent free pastes and/or powder may be used, which may directly be introduced into the heating module.

The invention claimed is:

1. Cooling module for cooling substrates after passing through a heating module, said cooling module comprising:
    an elongated cooling chamber having an inlet opening adjacent to the heating module and an outlet opening;
    a transport unit for transporting substrates through the elongated cooling chamber, said transport unit defining a transport plane for the substrates;
    at least one first cooling unit having a plurality of first plate elements, which extend in substance perpendicular to and above the transport plane in the cooling chamber, at least one first conduit extending through the first plate elements and being in thermally conducting relationship therewith, and at least one conveying unit for conveying a cooling fluid through the first conduit;
    a conveying unit for conveying gas, in particular air, via spaces between the plate elements towards the transport plane; and
    at least one second cooling unit having a plurality of second plate elements, which extend in substance perpendicular to and below the transport plane in the cooling chamber, at least one second conduit, which extends through the second plate elements and is in a thermally conducting relationship therewith, and at least one conveying unit for conveying a cooling fluid through the second conduit.

2. Cooling module according to claim 1, wherein the cooling module is adapted for cooling solar cells having a paste printed thereon.

3. Cooling module according to claim 1, wherein the first and/or second plate elements extend in a transverse direction of the cooling chamber.

4. Cooling module according to claim 1, wherein the transport unit comprises a revolving, gas permeable transport belt, said transport belt having a transport section and a return section, wherein at least one portion of the transport section and at least one portion of the return section extend through at least a portion of the cooling chamber.

5. Cooling module according to claim 4, wherein the second cooling unit is arranged between the portion of the transport section and the portion of the return section.

6. Cooling module according to claim 1, wherein the cooling chamber comprises in a longitudinal direction thereof at least two sections, wherein for each section a conveying unit for conveying gas through the cooling chamber is provided, wherein the conveying unit of the section, which is closer to the inlet opening of the cooling chamber, is supplied at least partially with gas from a neighboring section.

7. Cooling module according to claim 6, comprising means for setting different flow velocities in the sections.

8. Cooling module according to claim 1, wherein the conveying unit for conveying gas comprises at least one first blower for blowing gas into the cooling chamber and a second blower for aspirating gas from the cooling chamber, wherein the first and second blowers are arranged on opposite sides of the cooling chamber and are in communication with respective flow openings.

9. Cooling module according to claim 8, wherein the blowers are in substance matched to each other such that the air supplied by the first blower is in substance completely discharged via the second blower.

10. Cooling module according to claim 1, wherein the conveying unit for conveying gas comprises means for homogeneously distributing the gas in a transverse direction of the cooling chamber.

11. Apparatus for thermally treating substrates, comprising:
a heating module having an elongated heating chamber and a cooling module adjacent thereto, said cooling module being constructed in accordance with claim 1;
a transport unit for transporting the substrates through the heating chamber and the cooling chamber, wherein the transport unit has a revolving, gas permeable transport belt, having a transport section and a return section, wherein the transport section extends through the heating chamber and the cooling chamber and wherein the return section has a portion which extends through at least a portion of the cooling chamber and wherein the return section is arranged outside of the heating chamber.

12. Apparatus according to claim 11, wherein the apparatus is adapted for treating solar cells having a paste printed thereon.

13. Apparatus according to claim 11, wherein the apparatus further comprises a drying module having an elongated drying chamber, wherein the transport section of the transport belt also extends through the drying chamber.

* * * * *